United States Patent [19]

Davenport et al.

[11] Patent Number: 5,252,865
[45] Date of Patent: Oct. 12, 1993

[54] INTEGRATING PHASE DETECTOR

[75] Inventors: William H. Davenport, Hillsboro; Gary D. McCormack, Aloha, both of Oreg.

[73] Assignee: TriQuint Semiconductor, Inc., Beaverton, Oreg.

[21] Appl. No.: 748,799

[22] Filed: Aug. 22, 1991

[51] Int. Cl.$^5$ .......................... H03K 5/26; H03K 9/06
[52] U.S. Cl. .................... 307/514; 307/471; 328/127; 328/133
[58] Field of Search ............. 328/133, 134; 307/471, 307/479, 511, 514, 279

[56]     References Cited
       U.S. PATENT DOCUMENTS

| | | | |
|---|---|---|---|
| 3,710,140 | 1/1973 | Volmerange | 307/479 |
| 3,714,463 | 1/1973 | Laune | 307/232 |
| 4,041,326 | 8/1977 | Robinson | 307/471 |
| 4,160,217 | 7/1979 | Mitsuo | 331/8 |
| 4,339,731 | 7/1982 | Adams | 328/134 |
| 4,450,410 | 5/1984 | Kliger et al. | 328/155 |
| 4,535,459 | 8/1985 | Hogge, Jr. | 375/80 |
| 4,642,575 | 2/1987 | Hirosaki et al. | 331/1 A |
| 4,644,567 | 2/1987 | Artun et al. | 375/108 |
| 4,649,353 | 3/1987 | Sonnenberg | 331/8 |
| 4,656,431 | 4/1987 | Chapman | 328/134 |
| 4,668,918 | 5/1987 | Adams | 328/155 |
| 4,672,597 | 6/1987 | Yamazaki | 369/59 |
| 4,686,481 | 8/1987 | Adams | 328/133 |
| 4,713,830 | 12/1987 | McDonald | 375/109 |
| 4,750,193 | 6/1988 | Bailey | 375/81 |
| 4,766,397 | 8/1988 | Adams | 331/1 A |
| 4,809,306 | 2/1989 | Somer | 375/120 |
| 4,814,726 | 3/1989 | Byrd et al. | 331/1 A |
| 4,857,866 | 8/1989 | Tateishi | 331/1 A |
| 4,940,952 | 7/1990 | Kegasa | 307/516 |
| 4,970,475 | 11/1990 | Gillig | 331/25 |
| 4,975,660 | 12/1990 | Svenson | 331/1 A |
| 4,987,387 | 1/1991 | Kennedy et al. | 331/1 A |
| 5,008,637 | 4/1991 | Ray | 331/8 |
| 5,053,649 | 10/1991 | Johnson | 307/514 |
| 5,122,687 | 7/1979 | Mitsuo | 331/8 |

FOREIGN PATENT DOCUMENTS

| | | | |
|---|---|---|---|
| 3829164C1 | 8/1988 | Fed. Rep. of Germany | 19/21 |
| 1262878 | 6/1969 | United Kingdom | 3/20 |
| 2146863A | 9/1984 | United Kingdom | 19/86 |

OTHER PUBLICATIONS

IEEE Transactions on Electron Devices, vol. 32, No. 6, Jun. 1985, New York US pp. 1114–1118 Shiichi Katsu et al. "A Source Coupled FET Logic—A New Current-Mode Approach to GaAs Logics".

Primary Examiner—Timothy P. Callahan
Attorney, Agent, or Firm—Skjerven, Morrill, MacPherson, Franklin & Friel

[57]     ABSTRACT

An integrating phase detector includes a phase comparator and an integrating load impedance. The phase comparator is a voltage-input, current-output logic gate such as a OR/NOR gate, or a XOR/XNOR gate having first and second inputs for comparing the phase of first and second input signals. The current output of the logic gate provides an output current pulse proportional to the phase difference between the first and second input signals. The integrating load such as a passive resistor-capacitor network is coupled to the current output of the phase detector for directly integrating the current pulse and providing a DC voltage proportional to the phase difference between the first and second input signals. The minimum pulse width of the output current pulse is substantially limited only by the fT of the devices used in the logic gate. The improved bandwidth of the phase detector also increases the linear operating range by increasing the range of phase in which the output current pulse is proportional to the input phase difference.

10 Claims, 4 Drawing Sheets

INTEGRATING PHASE DETECTOR

BACKGROUND OF THE INVENTION

The invention pertains to phase detectors, and more particularly, to an apparatus and method for increasing the bandwidth and linear operating range of the phase detector.

Phase detectors (also sometimes referred to as phase discriminators) are well known in the art for comparing the phase of two digital signals and converting the phase difference into a DC error voltage. The DC error voltage is typically amplified and used to drive a voltage controlled oscillator in a phase locked loop. Phase locked loops are used in FM demodulation, frequency synthesizing, frequency multiplication, and other applications.

A conventional phase detector 10 is shown in FIG. 1. Phase detector 10 includes three separate and distinct functional blocks: a phase comparator 12, an amplifier 14, and an integrator 16. The phase comparator 12 is shown as a differential NOR gate for providing a digital pulse whose duration is proportional or at least highly correlated with the phase difference between the input waveforms. Therefore, phase comparator 12 receives a first differential input designated A and NA at terminals 20 and 21, and a second differential input designated B and NB at terminals 22 and 23. A differential output pulse designated PI (phase information) and NPI is provided at the output of phase comparator 12. Referring now to FIG. 2, the NOR function of the comparator 12 is shown, wherein PI is at a logic high level if both the A and B inputs are at a logic low level. Phase comparator 12 can also be a single-ended or differential OR gate, exclusive OR gate ("XOR") or exclusive NOR gate ("NXOR"). The XOR and NXOR gates require additional devices to build, but, since they act on both the rising and falling edges of the input signals, supply approximately twice as much energy to the amplifier 14 and integrator 16 for conversion to the DC error signal.

Amplifier 14 is a conventional differential amplifier having a voltage or current controlled output and a predetermined gain for boosting the amplitude of the error pulse from the phase comparator 12. The integrator 16 is a conventional passive integrating circuit including resistors R1, R3, and capacitor C1 coupled to the inverting output terminal 24, and resistors R2, R4, and capacitor C2 coupled to the noninverting output terminal 25. The differential DC output error voltages are designated NPHASE and PHASE. The magnitude of each of the DC error voltages is set by the phase amplifier 14 and the responsiveness of the error voltages is set by the time constants R1C1 and R2C2.

An improved phase detector is shown in U.S. Pat. No. 4,535,459 ("'459") to Charles R. Hogge, Jr. entitled "Signal Detection Apparatus." While the phase detector taught in the '459 patent includes advantages over the prior art phase detector 10 shown in FIG. 1, the phase comparator is separate and distinct from the integrator. Note in FIG. 3 of the '459 patent that XOR gates 46 and 52 drive separate integrator blocks 70 and 74 through an intermediate resistor and capacitor network.

The problem with all such configurations is that the bandwidth of the phase detector is limited by the bandwidth of the phase comparator, approximately equal to one and one half times the propogation delay through the OR/NOR, XOR/XNOR gate used in the phase detector. More precisely, the bandwidth of the gate is a function of the switching speed of the devices used, the gain, and the associated internal and load RC time constants. The dominant poles for the frequency response of the gate are inverse products of the RC time constant and gain, and therefore occur at a significantly lower frequency than the Ft of the devices used in the gate. The error pulse created by the phase comparator is thus filtered by the bandwidth of the comparator. As the phase difference between the inputs approaches 180 degrees or −180 degrees the desired error pulse approaches zero pulse width. Such a pulse is heavily attenuated by a low bandwidth phase comparator and is therefore less useful to provide accurate information proportional to the phase difference between the input signals.

Referring now to FIG. 3, output pulses from a typical bandwidth limited phase comparator are plotted for four phase differences approaching −180 degrees of phase difference. In the uppermost waveform, $\phi_3$, the phase difference relatively far from −180 degrees, and the pulse required to represent this distance is accurately created by the phase comparator. As the phase difference becomes closer to −180 degrees, the pulse width decreases, but is still capable of being generated as shown in the $\phi_2$ waveform. As the phase difference further approaches −180 degrees, the output pulse becomes filtered by the bandwidth of the phase comparator, resulting in the "runt" pulse shown in the $\phi_1$ waveform. The runt pulse does not have the same energy as the desired pulse, and therefore is not proportional to the phase difference of the input signals. Finally, as the phase difference requires a pulse that is almost completely filtered out as shown in the $\phi_0$ waveform. Any phase differences beyond this point have virtually no effect on the output of the phase comparator.

Referring now to FIG. 4, an ideal plot of phase difference versus phase comparator output pulse width is shown in a solid line. The ideal characteristics for pulse width are a sawtooth waveform in which the pulse width is zero (0% duty cycle) at −180 degrees, and reaches a maximum pulse width (100% duty cycle) at 180 degrees. Ideally, the pulse width is linear between the two phase extremes. The sawtooth pattern repeats for phase differences less than −180 degrees and phase differences greater than 180 degrees. The non-ideal, bandwidth limited response is shown in dashed lines. At small phase differences, the output pulse width is sufficiently large that the effects of the bandwidth are not noticeable, the response lying on the ideal linear curve. However, as the phase difference approaches −180 degrees and 180 degrees, the bandwidth limiting effect appears, and the response becomes essentially flat, providing no information as to the phase difference. The effect at −180 degrees and 180 is usually asymmetrical, further complicating the response of the phase detector.

In operation, a phase locked loop using a bandwidth limited phase comparator will not be able to respond as quickly or over as great a phase difference range as a phase lock loop with an ideal phase comparator. If the input frequency drifts to far from the center frequency (phase difference approaching −180 or 180 degrees), the phase locked loop will lack sufficient gain to "push" the input frequency back to the center frequency.

Therefore, what is desired is a phase detector that does not have the problems associated with the generation and amplification of narrow voltage pulses, is not limited by the bandwidth of the phase comparator, and has a bandwidth as close as possible to the fT of the devices used in the phase detector.

SUMMARY OF THE INVENTION

It is therefore a principal object of the present invention to provide an integrating phase detector having a bandwidth substantially limited by the fT of the devices used in the phase detector.

It is another object of the present invention to increase the linear operating range of the integrating phase detector.

It is yet another object of the present invention to improve bandwidth and linearity by combining functional blocks of prior art phase detectors.

It is an advantage that a portion of the phase detector of the present invention can be readily fabricated on an integrated circuit in conjunction with an external integrating impedance.

According to the present invention, an integrating phase detector includes a phase comparator and an integrating load impedance. The phase comparator is a voltage-input, current-output logic gate such as a OR/NOR gate, or a XOR/XNOR gate having first and second inputs for comparing the phase of first and second input signals. The current output of the logic gate provides an output current pulse proportional to the phase difference between the first and second input signals. The integrating load such as a passive resistor-capacitor network is coupled to the current output of the phase comparator for integrating the current pulse and providing a DC voltage proportional to the phase difference between the first and second input signals. The output current pulse is directly integrated by the integrating load and not converted into an intermediate voltage as in prior art phase detectors. Therefore, the minimum output current pulse is substantially limited only by the fT of the devices used in the logic gate. The improved bandwidth of the phase detector also increases the linear operating range by increasing the range of phase in which the output current pulse is proportional to the input phase difference.

In a preferred embodiment, the logic gate, inputs signals, and output signals are all differential. The differential logic gate is fabricated on an integrated circuit wherein the output current pulse is delivered to a pair of bonding pads. The integrating load includes two discrete resistor-capacitor networks coupled to each bonding pad to provide a differential DC error voltage. The parasitic capacitance of the bonding pad is used in the calculation of the integrating load capacitance and does not substantially affect the minimum output current pulse of the phase comparator. If desired, and the time constant of the application permits, the integrating load can also be fabricated on the same integrated circuit.

The foregoing and other objects, features and advantages of the present invention are more readily apparent from the following detailed description of a preferred embodiment that proceeds with reference to the drawings.

DETAILED DESCRIPTION

Figure 1:
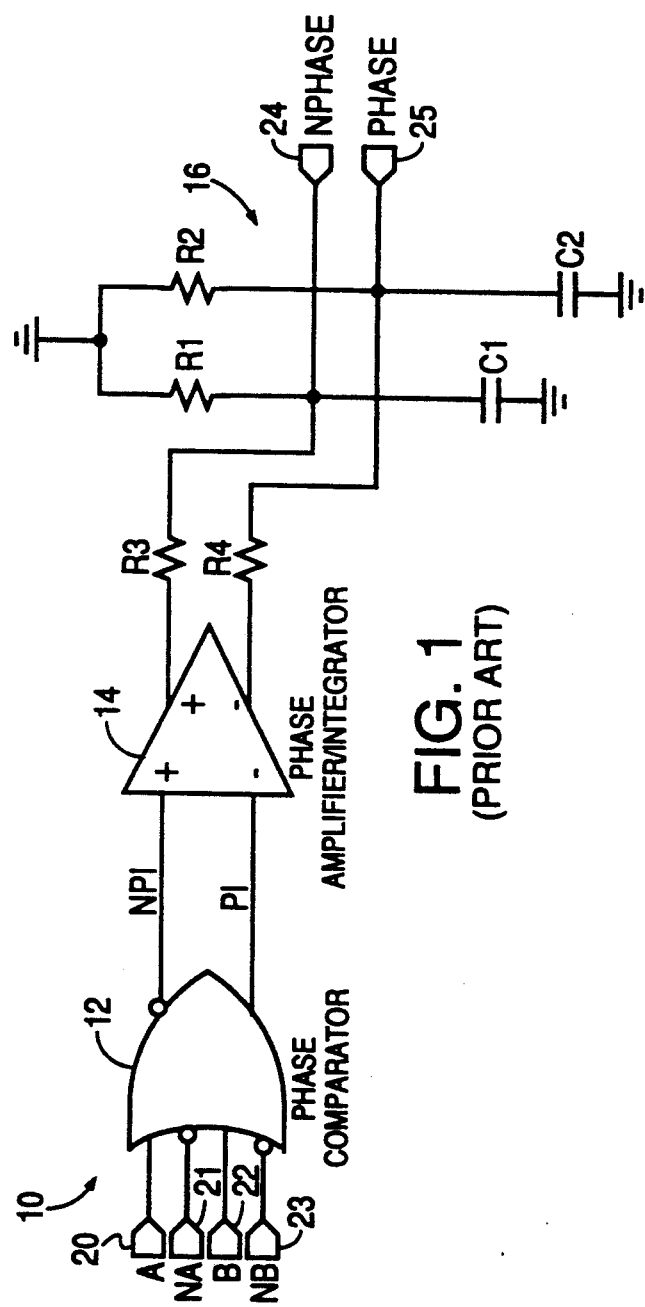
FIG. 1 is a schematic diagram of a prior art phase detector including a phase comparator, a phase amplifier, and an integrator.
Figure 2:
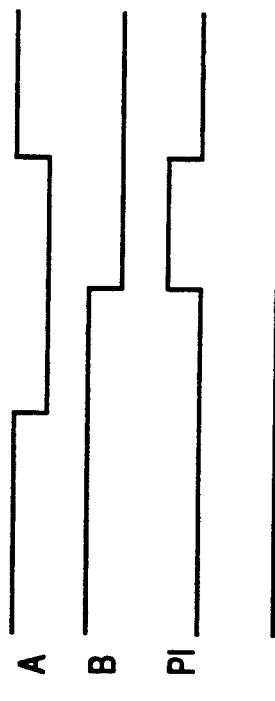
FIG. 2 is a timing diagram illustrating the performance of the prior art phase detector.
Figure 3:
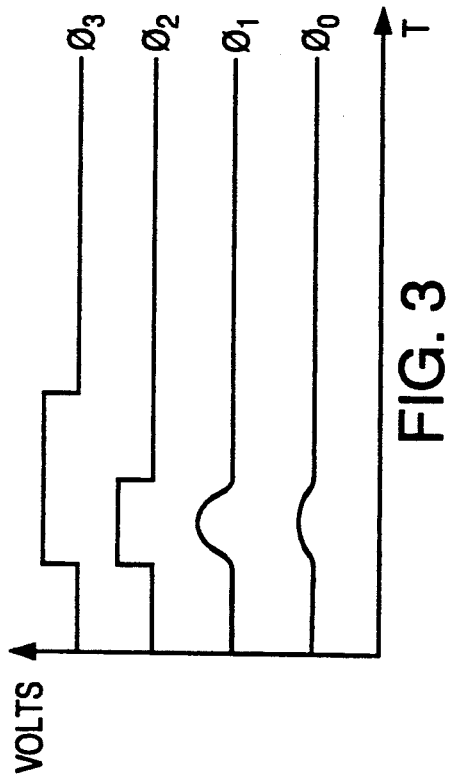
FIG. 3 is a plot of four output pulses from a bandwidth limited phase comparator for four phase differences successively approaching −180 degrees.
Figure 4:
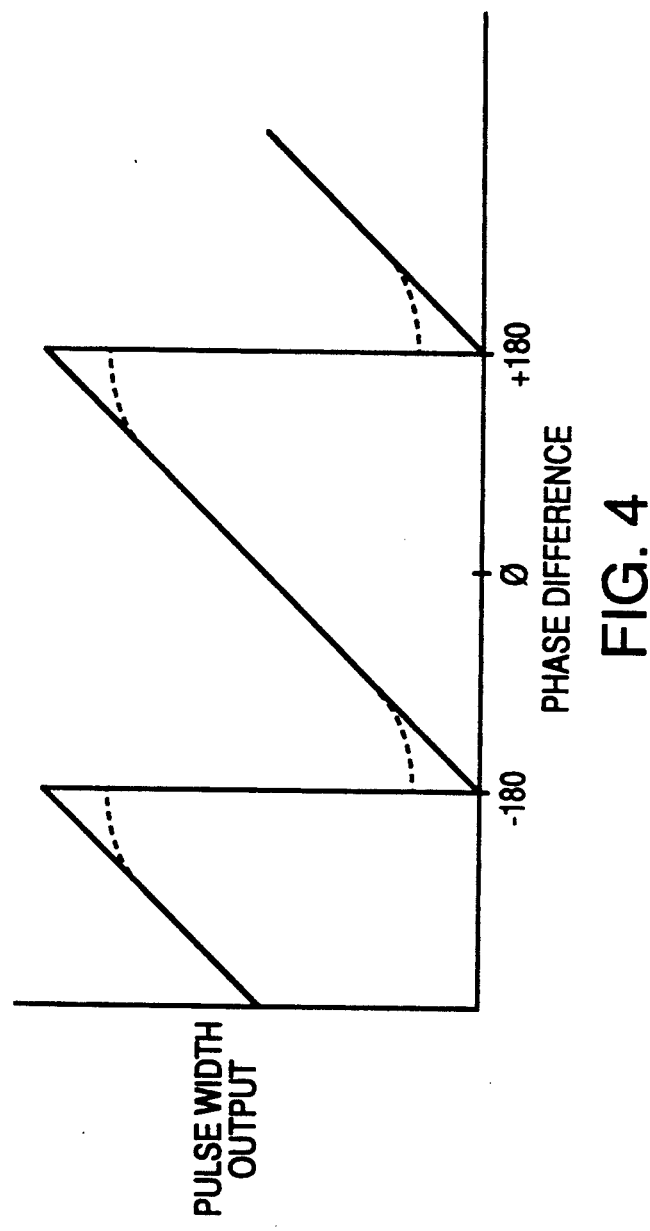
FIG. 4 is a phase diagram that plots phase comparator pulse width output versus input phase difference for an ideal comparator and a bandwidth limited phase comparator.
Figure 5:
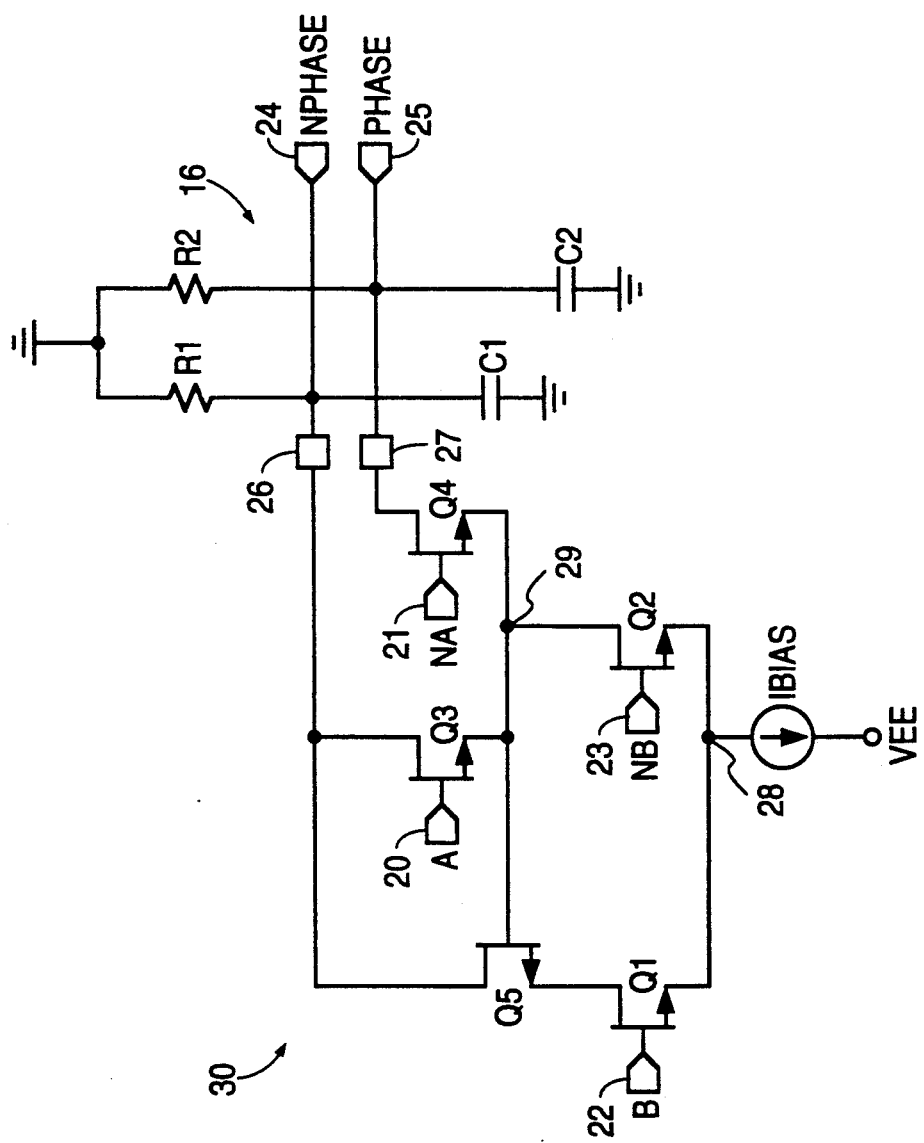
FIGS. 5 and 6 are first and second embodiments of integrated phase detectors according to the present invention.

Referring now to FIG. 5, a first embodiment of the phase detector is shown as an integrated OR/NOR phase detector 30. Integrated phase detector 30 includes a differential OR/NOR logic gate having first and second differential voltage inputs for receiving first and second differential input signals A/NA and B/NB on terminals 20-23. The OR/NOR gate has a current output for providing a current pulse proportional to the phase difference between the first and second input signals. An integrating load 16 is coupled to the current output of the logic gate at bond pads 26 and 27 for integrating the current pulse and providing a differential DC voltage proportional to the phase difference between the first and second input signals at terminals 24 and 25, designated NPHASE and PHASE.

The differential OR/NOR gate includes a first differential pair of transistors Q3 and Q4 having a differential input for receiving the first differential input signal A/NA. The differential input is formed by the gates of transistors Q3 and Q4 at terminals 20 and 21. The differential output of transistors Q3 and Q4, at the drains of transistors Q3 and Q4, provides a portion of the output differential current of the OR/NOR gate at bond pads 26 and 27. The first differential pair of transistors includes a first bias node 29 for receiving a switched bias current. A second differential pair of transistors Q1 and Q2 has a differential input for receiving the second differential input signal B/NB. The differential input is formed by the gates of transistors Q1 and Q2 at terminals 22 and 23. The current output of the second differential pair of transistors Q1 and Q2 provides a portion of the output differential current of the OR/NOR gate at bond pad 26 and the switched bias current to the first differential pair of transistors at bias node 29. The second differential pair of transistors Q1 and Q2 has a second bias node 28 for receiving a bias current IBIAS. Transistor Q5 is used for equalizing the delay of the first and second differential pairs of transistors. The integrating load 16 includes a first parallel combination of a resistor R1 and a capacitor C1 coupled to bond pad 26 and a second parallel combination of a resistor R2 and a capacitor C2 coupled to bond pad 27.

In operation, the phase detector 30 receives four possible pairs of digital voltage inputs and provides a OR/NOR current output. Assume for purpose of analysis that C1 and C2 are equal to zero. Therefore, the current output of the OR/NOR gate is immediately transformed into a voltage through R1 and R2. When A and B are both at a logic zero, Only transistors Q2 and Q4 are on, and NPHASE is at a logic one, and PHASE is at a logic zero. When A is a logic zero and B is at a logic one, transistors Q1 and Q4 are on. Therefore NPHASE is now at a logic zero, and PHASE is at a logic one. When A is a logic one and B is at a logic zero, transistors Q2 and Q3 are on, and therefore NPHASE is at a logic zero, and PHASE is at a logic one. When A and B are both at a logic one, transistors Q1 and Q3 are on, NPHASE is at a logic zero, and PHASE is at a logic one.

In actual operation, the current outputs of the OR/NOR gate are directly integrated into a differential DC error voltage. Therefore, the actual logic states of the OR/NOR gate are only provided as current pulses.

In the preferred embodiment, the logic gate portion of phase detector 30, including transistors Q1-Q4 and current source IBIAS, is fabricated on an integrated circuit. The current outputs of the logic gate pass through bond pads 26 and 27, which are coupled to the external integrating load 16. The current is then transformed into a differential DC current. Any parasitic capacitance associated with the bond pads 26 and 27, or the drains of transistors Q3-Q5 does not affect the minimum pulse width of the output current pulse. Such parasitic capcitance can be estimated and added into the total integrating capacitance C1 and C2. The parasitic capacitance primarily affects the responsiveness of the DC output voltage to changes in the input phase, but does not affected the ability of the phase detector 30 to generate a short pulsewidth output current. The minimum pulsewidth is primarily affect by the fT of transistors Q1-Q4. If desired, the integrating load 16 may be partially or wholly integrated onto the same integrated circuit.

Of significance is the absence of any kind of buffer or amplifier stage. The current pulses produced directly by the logic gate are integrated with no loss of frequency response. Furthermore, the parasitic capacitance of bonding pads 26 and 27 does not detract from the frequency response of the detector.

Figure 6:
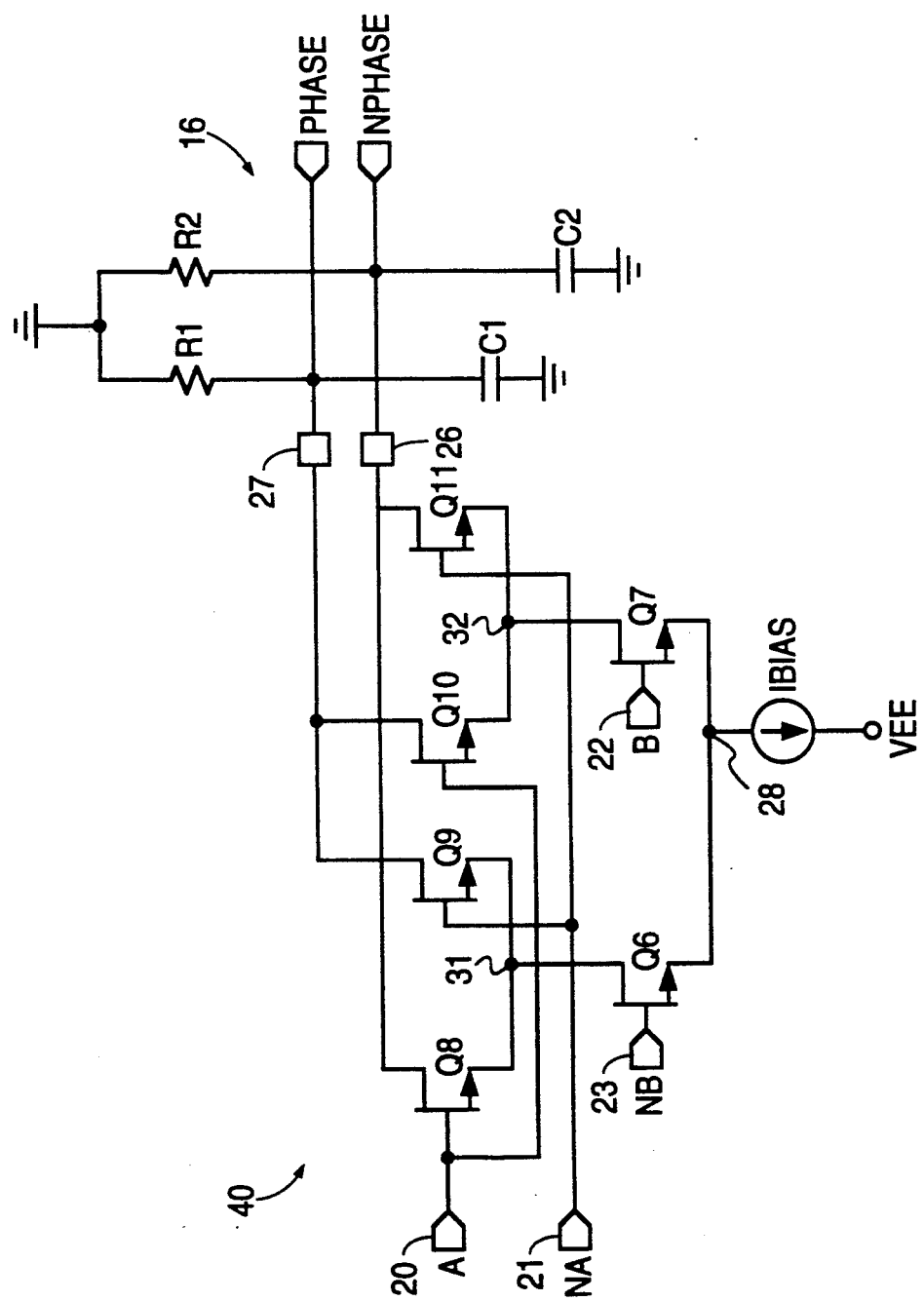

A second embodiment of the integrating phase detector 40 is shown in FIG. 6 in which the logic gate is an XOR/XNOR gate. The integrating load 16, voltage inputs on terminals 20-23, current outputs, bond pads 26 and 27, and bias current IBIAS are the same as the phase detector 30 shown in FIG. 5. However, the logic operation and the transistor level schematic of the XOR/XNOR gate are different. This gate can be used to provide more gain as explained above.

The differential XOR/XNOR gate includes first and second differential pairs of transistors Q8-Q9 and Q10-Q11 having coupled differential inputs for receiving the first differential input signal A/NA at terminals 20 and 21. The gates of transistors Q8 and Q10 are therefore coupled together to receive the A input, and the gates of transistors Q9 and Q11 are coupled together to receive the NA input. The first and second differential pairs of transistors have cross-coupled differential outputs for providing the differential current output to the integrating load 16. The drains of transistors Q8 and Q11 are coupled together to provide the current to one half of the integrating load 16 through bond pad 26, and the drains of transistors Q9 and Q10 are coupled together to provide the current to the other half of the integrating load through bond pad 27. The first and second differential pairs of transistors have respective first and second bias nodes 31 and 32 for receiving switched bias currents. A third differential pair of transistors Q6 and Q7 has a differential input for receiving the second differential input signal B/NB at terminals 22 and 23. The differential current output of the third differential pair of transistors is coupled to the first and second bias nodes. The third differential pair of transistors also has a third bias node 28 for receiving the bias current IBIAS.

In operation, the phase detector 40 receives the same four possible pairs of digital voltage inputs and provides an XOR/XNOR current output. Again assume for purpose of analysis that C1 and C2 are equal to zero. Therefore, the current output of the XOR/XNOR gate is immediately transformed into a voltage through R1 and R2. When A and B are both at a logic zero, transistors Q6 and Q9 are on, and NPHASE is at a logic one, and PHASE is at a logic zero. When A is a logic zero and B is at a logic one, transistors Q7 and Q11 are on. Therefore NPHASE is now at a logic zero, and PHASE is at a logic one. When A is a logic one and B is at a logic zero, transistors Q6 and Q8 are on, and therefore NPHASE is at a logic zero, and PHASE is at a logic one. When A and B are both at a logic one, transistors Q7 and Q10 are on, NPHASE is at a logic one, and PHASE is at a logic zero.

As in the previous embodiment, in actual operation, the current outputs of the XOR/XNOR gate are directly integrated into a differential DC error voltage. In the preferred embodiment, the logic gate portion of phase detector 40, including transistors Q6-Q11 and current source IBIAS, is fabricated on an integrated circuit. The current outputs of the logic gate pass through bond pads 26 and 27 to the external integrating load 16, retaining the speed advantage, which decouples performance from the parasitic capacitance at bond pads 26 and 27. The minimum pulsewidth provided by the XOR/XNOR gate is still primarily affected only by the fT of transistors Q6-Q11.

Having illustrated and described the principles of my invention in a preferred embodiment thereof, it is apparent to those skilled in the art that the invention can be modified in arrangement and detail without departing from such principles. For example, the circuit blocks described above can be realized with other circuits yet provide the same function. High speed bipolar transistors or other devices can be substituted for the FETs shown and described above. Further, component values and device sizes can be changed to better fit the requirements of a specific application. We therefore claim all modifications coming within the spirit and scope of the accompanying claims.

We claim:

1. An integrating phase detector comprising:
   a logic gate having first and second inputs for receiving first and second input signals, the logic gate further having a current output for providing a current pulse proportional to the phase difference between the first and second input signals, the current output having a minimum pulsewidth substantially limited only by the $f_T$ of devices comprising the logic gate; and
   integrating loads means directly connected to the current output of the logic gate for integrating the current pulse to provide a DC voltage proportional to the phase difference between the first and second input signals;
   wherein the logic gate comprises a differential OR gate having first and second differential inputs and a differential current output including a noninverting and an inverting single-ended output; and
   wherein the differential OR gate comprises:
   a first differential pair of transistors having a differential input for receiving the first differential input signal, a differential output forming the differential current output, and a first bias node; and a second differential pair of transistors having a differential input for receiving the second differential input signal, an output coupled between one of the single-ended outputs and the first bias node, and a second bias node for receiving a bias current.

2. An integrating phase detector comprising:

a logic gate having first and second inputs for receiving first and second input signals, the logic gate further having a current output for providing a current pulse proportional to the phase difference between the first and second input signals, the current output having a minimum pulsewidth substantially limited only by the $f_T$ of devices comprising the logic gate; and integrating loads means directly connected to the current output of the logic gate for integrating the current pulse to provide a DC voltage proportional to the phase difference between the first and second input signals;

wherein the logic gate comprises a differential XOR gate having first and second differential inputs and a differential current output including a noninverting and an inverting signal-ended output.

3. An integrating phase detector as in claim 2 in which the differential XOR gate comprises:

first and second differential paris of transistor s having coupled differential inputs for receiving the first differential input signal, cross-coupled differential outputs forming the differential current output, and respective first and second bias nodes; and a third differential pair of transistors having a differential input for receiving the second differential input signal, a differential output coupled to the first and second bias nodes, and a third bias node for receiving a bias current.

4. An integrating phase detector as in claim 2 in which the integrating load means comprises a first parallel combination of a resistor and a capacitor coupled to the non-inverting output and a second parallel combination of a resistor and a capacitor coupled to the inverting output.

5. A method of converting the phase difference between two input signals into a DC error voltage, the method comprising the steps of:

generating on an integrated circuit a current pulse proportional to the phase difference between the first and second input signals;

providing the current pulse at a bonding pad of the integrated circuit; and integrating the current pulse to provide a DC error voltage proportional to the phase difference between the first and second input signals;

wherein the step of integrating the current pulse comprises the steps of:

coupling a resistor having a value of R ohms to the bonding pad of the integrated circuit;

coupling a capacitor having a value of C microfarads to the bonding pad of the integrated circuit; and adjusting the mathematical product of R times C to set the responsiveness of the DC error voltage to changes in the phase difference.

6. A method of converting the phase difference between two input signals into a DC error voltage, the method comprising the steps of:

generating on an integrated circuit a current pulse proportional to the phase difference between the first and second input signals;

providing the current pulse at a bonding pad of the integrated circuit; and integrating the current pulse to provide a DC error voltage proportional to the phase difference between the first and second input signals;

wherein the step of integrating the current pulse comprises the steps of:

coupling a resistor having a value of R ohms to the bonding pad of the integrated circuit;

coupling a capacitor having a value of C microfarads to the bonding pad of the integrated circuit; and adjusting the value of the resistor R to set the amplitude of the DC error voltage.

7. A method of converting the phase difference between two input signals into a DC error voltage, the method comprising the steps of:

providing a logic gate having first and second voltage inputs and a current output;

coupling first and second input signals to the respective first and second voltage inputs;

generating a current pulse proportional to the phase difference between the first and second input signals;

providing an integrating load impedance; coupling the current pulse directly to the integrating load impedance;

generating a DC error voltage proportional to the phase difference between the first and second input signals;

generating the current pulse on an integrated circuit; providing the current pulse at a bonding pad of the integrated circuit; and coupling the integrating load impedance to the bonding pad of the integrated circuit.

8. The method of claim 7 in which the step of coupling the integrating load impedance comprises the steps of:

coupling a resistor having a value of R ohms to the bonding pad of the integrated circuit; and coupling a capacitor having a value of C microfarads to the bonding pad of the integrated circuit.

9. The method of claim 8 further comprising the step of adjusting the mathematical product of R times C to set the responsiveness of the DC error voltage to changes in the phase difference.

10. The method of claim 8 further comprising the step of adjusting the value of the resistor R to set the amplitude of the DC error voltage.

* * * * *

UNITED STATES PATENT AND TRADEMARK OFFICE
CERTIFICATE OF CORRECTION

PATENT NO. : 5,252,865
DATED : October 12, 1993
INVENTOR(S) : William H. Davenport and Gary D. McCormack It is certified that error appears in the above-indentified patent and that said Letters Patent is hereby corrected as shown below:

Column 5, line 22, delete "affected" and insert --affect --.

Column 5, line 24, delete "affect" and insert --affected --.

Column 7, line 29, claim 3, delete "paris" and insert -- pairs-- delete "transistor s" and insert --transistors --.

Signed and Sealed this

Sixth Day of September, 1994

Attest:

BRUCE LEHMAN

Attesting Officer                Commissioner of Patents and Trademarks